United States Patent [19]
Park et al.

[11] Patent Number: 5,918,142
[45] Date of Patent: Jun. 29, 1999

[54] METHOD FOR FABRICATING A SEMICONDUCTOR DEVICE

[75] Inventors: Heung Lak Park; Sang Hyeob Lee, both of Ichon-shi, Rep. of Korea

[73] Assignee: Hyundai Electronics Industries Co., Ltd., Ichon-shi, Rep. of Korea

[21] Appl. No.: 08/883,376

[22] Filed: Jun. 26, 1997

[30] Foreign Application Priority Data

Jun. 27, 1996 [KR] Rep. of Korea ................... 96-24253

[51] Int. Cl.$^6$ ........................................... H01L 21/3205
[52] U.S. Cl. ........................ 438/585; 438/631; 438/760
[58] Field of Search ................................ 438/585, 631, 438/632, 694, 698, 760

[56] References Cited

U.S. PATENT DOCUMENTS 5,466,629  11/1995  Mihara et al. ............................. 438/3
5,567,651  10/1996  Berti et al. ............................. 438/303

*Primary Examiner*—John F. Niebling
*Assistant Examiner*—Christopher Lattin
*Attorney, Agent, or Firm*—Thelen Reid & Priest LLP

[57] ABSTRACT

A method for fabricating a semiconductor device, wherein, when a blanket of the planarization layer is deposited and thermally treated for its reflow after the formation of a metal gate electrode consisting of a CVD-TiN layer pattern and a W layer pattern on a semiconductor substrate, a gate oxide is formed at the interface between the CVD-TiN layer and the semiconductor substrate by the reaction of the moisture absorbed in the CVD-TiN layer with the Si of the substrate, without executing an additional process and, thus, the stress between the gate oxide and the metal layer is not high, so that the gate oxide can be prevented from being degraded, and the production yield and the reliability of device operation is improved.

7 Claims, 2 Drawing Sheets

METHOD FOR FABRICATING A SEMICONDUCTOR DEVICE

BACKGROUND OF THE INVENTION.

1. Field of the Invention

The present invention relates, in general, to a method for fabricating a semiconductor device and, more particularly, to the use of the porosity of TiN layer in absorbing moisture and oxygen therein so that they can react with the Si of the semiconductor substrate to create an gate oxide without a separate step, thereby improving the production yield and the reliability of device operation.

2. Description of the Prior Art

At a sacrifice of the width in the gate electrode of MOSFET, the high integration of semiconductor devices is usually accomplished. However, n-folds decrease in the width of the gate electrode causes n-folds increase in the electric resistance thereof, resulting in lowering the operational speed of the semiconductor device. In order to reduce the resistance of gate electrode, a polycide, a lamination structure of polysilicon layer and silicide, is used as a low resistance gate, taking advantage of the property of the polysilicon layer/oxide film interface, which shows the most stable MOSFET attribute.

Generally, current driving ability is one of the most important functions the transistors constituting a semiconductor device circuit must have. In consideration of this, the channel width of MOSFET should be controlled. The widely used MOSFET employs an impurity-doped polysilicon layer as a gate electrode and a diffusion region as a source/drain region in which an impurity is doped on a semiconductor substrate. Typically, the gate electrode has a face resistance of about 30–70 $\Omega/\Box$ while the source/drain region has a face resistance ranging from about 70 to 150 $\Omega/\Box$ for $N^+$ and from about 100 to 250 $\Omega/\Box$ for $P^+$. A contact resistance of about 30–70 $\Omega/\Box$ per contact is allowed for the contacts which are formed in the gate electrode or the source/drain region.

In order to reduce the high resistances of the gate electrode and the source/drain region, and the contact resistance, a metal silicide film is formed only over the gate electrode and the source/drain region by a self-aligned silicide (salicide) process or a selective metal film deposition process, thereby improving the current driving ability of MOSFET.

For example, the employment of Ti silicide allows a reduction in the face resistance of the gate electrode and the source/drain electrode into 50 $\Omega/\Box$ or less, and the contact resistance into about 3 $\Omega/\Box$ per contact or less, giving rise to an increase in the current driving ability of MOSFET by 40% or more, so that the high integration of MOSFETs is possible.

Hence, it is increasingly necessary to reduce such face resistance by forming a silicide layer on the surfaces of both the gate electrode and the source/drain electrode in a DRAM device of 1 giga or more or in a logic device demanding high integration and high speed at the same time.

Particularly, recent research has been directed to the use of a low specific resistance metal, instead of polysilicon, in a word line which operates a transistor. Of various metals, tungsten attracts attention for gate metal by virtue of its high conductivity as expressed by a low specific resistance of about 11 $\mu\Omega cm$ and its high melting point of 3,400° C.

A description will be given of a conventional fabricating method of a semiconductor device in conjunction with FIG. 1.

First, a semiconductor substrate 10 is prepared in a predetermined region of which an element-isolating oxide 12 is formed. A gate oxide film 14 is formed over the semiconductor substrate 10 between the element-isolating oxides 12, followed by the sequential formation of a glue layer 16 of TiN and a W layer 18 over the resulting structure, as shown in FIG. 1A.

Then, the W layer 18 and the glue layer 16 are patterned in sequence to produce a gate electrode 20 consisting of a W layer pattern and a glue layer pattern, as shown in FIG. 1B. Thereafter, a source/drain region is created in a region of the semiconductor substrate 10 below both flanks of the gate electrode 20, to give a MOSFET.

This conventional fabricating method of a semiconductor device, however, has problems in that the stress attributed to the difference in the high coefficient of thermal expansion between a gate electrode and a gate oxide either degrades the gate oxide or separates the gate electrode.

SUMMARY OF THE INVENTION

An objective of the invention to overcome the above problems encountered in prior arts and to provide a simple method for fabricating a semiconductor device, which can prevent the degradation of the gate oxide and the separation of the gate electrode, thereby improving the production yield and the reliability of device operation.

Based on the intensive and thorough research of the present inventors, the above objective could be accomplished by a provision of a method for fabricating a semiconductor device, comprising the steps of: forming a TiN layer on a semiconductor substrate by a chemical vapor deposition technique; treating the semiconductor substrate in a tube under a predetermined condition to control the moisture and oxygen in the TiN layer; depositing a W layer over the TiN layer; patterning the W layer and the TiN layer, in order, to give a gate electrode; forming a blanket of a planarization layer over the resulting structure; reflowing the planarization layer by a thermal treatment to make the moisture and oxygen to react with the semiconductor substrate to form a gate oxide at the interface between the TiN layer and the semiconductor substrate.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

Figure 1A:
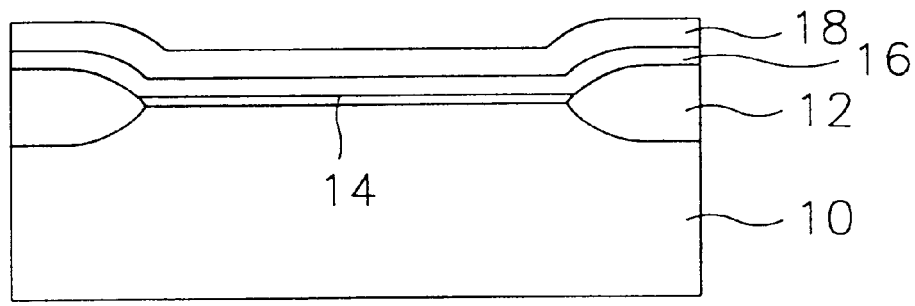
FIGS. 1A and 1B are schematic cross sectional views showing a conventional fabricating method of semiconductor device.
Figure 1B:
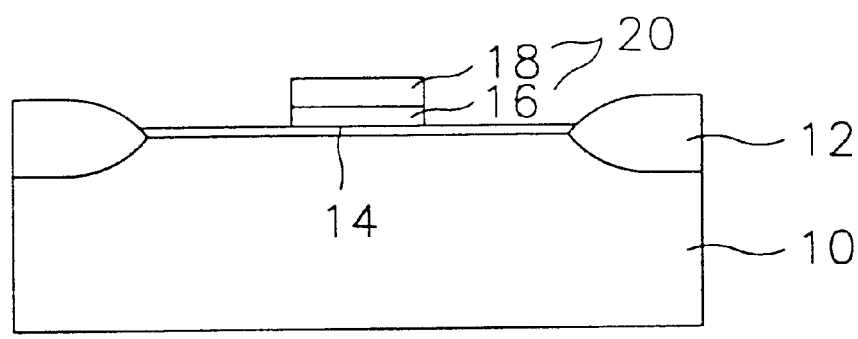

The application of the preferred embodiments of the present invention is best understood with reference to the accompanying drawings, wherein like reference numerals are used for like and corresponding parts, respectively.

Referring to FIG. 2, the fabrication processes of semiconductor device is illustrated according to the present invention.

Figure 2A:
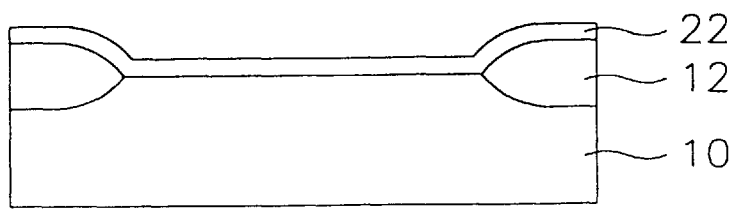
FIGS. 2A through 2D are schematic cross sectional views showing a method for fabricating a semiconductor device, according to the present invention.

First, an element-isolating oxide 12 is formed in a predetermined region of a Si semiconductor substrate 10 which is then washed with a HF dilute solution and, thereafter, tetrakisdimethyl aminotitanium (hereinafter referred to as "TDMAT") is deposited entirely over the resulting clean structure by a chemical vapor deposition (CVD) technique to form a TiN layer (hereinafter referred to as "CVD-TiN layer") 22, as shown in FIG. 2A. The CVD-TiN layer 22 ranges in thickness from 100 to 1,000 Angstrom while the CVD technique is carried out at a temperature of 300–500° C.

Since the CVD-TiN layer 22 has a porous structure, it can absorb a large quantity of moisture and oxygen. As will be illustrate later, when a reflow thermal treatment process is carried out for a planarization layer following the deposition of W and the formation of a word line, the absorbed moisture reacts with the Si semiconductor substrate 10 to form a $SiO_2$ layer to be a gate oxide.

Following the deposition of the CVD-TiN layer 22, the wafer is placed for a certain time in a tube wherein temperature, humidity and partial pressure of oxygen can be adjusted, in order to control the thickness of the gate oxide. For example, the wafer is maintained at a relative humidity of 10–100%, at a partial pressure of oxygen 0–0.9, at a temperature of 10–400° C. for 1–600 min after the CVD-TiN layer 22 is formed.

Figure 2B:
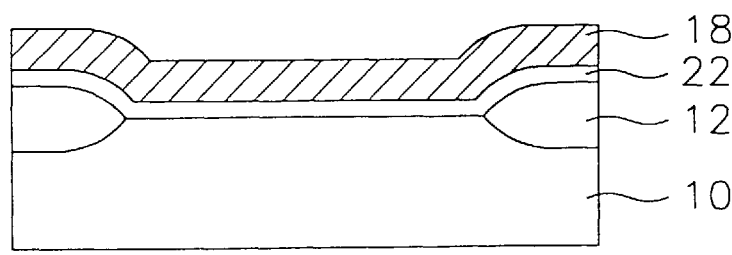

Next, as shown in FIG. 2B, a W layer 18 ranging in thickness from 500–5,000 Angstrom is deposited over the CVD-TiN layer 22.

Figure 2C:
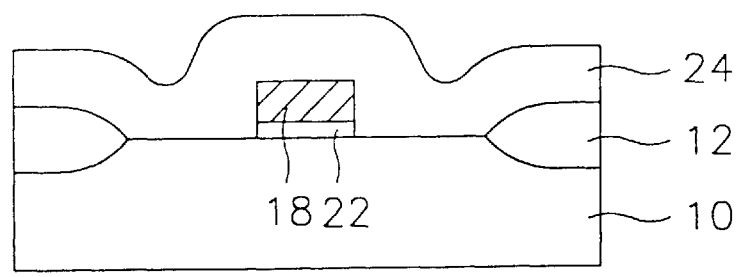

Thereafter, as shown in FIG. 2C, the W layer 18 and the CVD-TiN layer 22 are patterned in sequence to create a gate electrode 20 consisting of a W layer pattern and a CVD-TiN layer pattern.

Figure 2D:
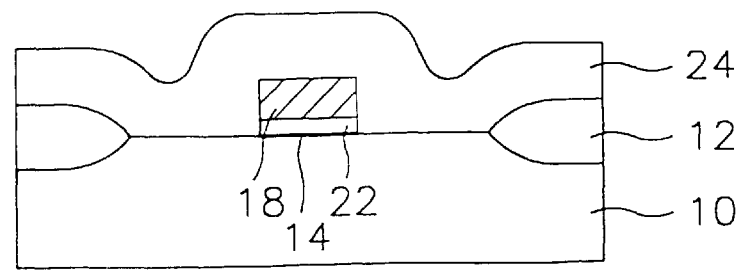

Although now shown, a source/drain region is created in the semiconductor substrate below both flanks of the gate electrode 20, and the gate electrode 20 is flanked by spacers. A blanket of a planarization layer 24 is formed over the resulting structure and planarized through reflowing which is accomplished by thermally treating the layer 24 at 700–1,000° C., as shown in FIG. 2D. Upon this thermal treatment, the moisture and oxygen of the CVD-TiN layer 22 is combined with the Si of the semiconductor substrate 10, to form a gate electrode 14 of $SiO_2$ at the interface between the semiconductor substrate 10 and the CVD-TiN layer 22. For the planarization layer 24, spin-on glass (SOG), borophosphor silicate glass (BPSG) or tetraethylorthosilicate (TEOS) is used.

As described hereinbefore, according to the method of the invention, when a blanket of the planarization layer is deposited and thermally treated for its reflow after the formation of the metal gate electrode consisting of the CVD-TiN layer and W layer patterns on the semiconductor substrate, the gate oxide is formed at the interface between the CVD-TiN layer and the semiconductor substrate by the reaction of the moisture absorbed in the CVD-TiN layer with the Si of the substrate, without executing an additional process. Thus, the stress between the gate oxide and the metal layer is not high, so that the gate oxide can be prevented from being degraded, thereby improving the production yield and the reliability of device operation.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for fabricating a semiconductor device, comprising the steps of:

forming a TiN layer on a semiconductor substrate by a chemical vapor deposition technique;

treating the semiconductor substrate in a tube under a predetermined condition to control the moisture and oxygen in the TiN layer;

depositing a W layer over the TiN layer;

patterning the W layer and the TiN layer, in order, to give a gate electrode;

forming a blanket of a planarization layer over the resulting structure;

reflowing the planarization layer by a thermal treatment to make the moisture and oxygen to react with the semiconductor substrate to form a gate oxide at the interface between the TiN layer and the semiconductor substrate.

2. A method in accordance with claim 1, wherein said TiN layer is formed of tetrakisdimethyl aminotitanium.

3. A method in accordance with claim 1, wherein said TiN layer is formed with a thickness of 100–1,000 Angstrom at a temperature of 300–500° C.

4. A method in accordance with claim 1, wherein said TiN layer is treated at a relative humidity of 10–100%, at an oxygen partial pressure of 0–0.9, at a temperature of 10–400° C. for 1–600 min.

5. A method in accordance with claim 1, wherein said W layer ranges in thickness from 500–5,000 Angstrom.

6. A method in accordance with claim 1, wherein said planarization is selected from the group consisting of a spin-on-glass film, a borophosphor silicate glass film and a tetraethylorthosilicate film.

7. A method in accordance with claim 1, wherein said reflowing step is carried out at a temperature of 700–1,000° C.

* * * * *